(12) United States Patent
Hendriks et al.

(10) Patent No.: US 7,345,739 B2
(45) Date of Patent: Mar. 18, 2008

(54) LITHOGRAPHIC ALIGNMENT SYSTEM AND DEVICE MANUFACTURING METHOD

(75) Inventors: Robert Frans Maria Hendriks, Eindhoven (NL); Egbert Lenderink, Waalre (NL); Rene Monshouwer, Eindhoven (NL); Alexander Marc Van Der Lee, Eindhoven (NL); Gert Wim 'T Hooft, Eindhoven (NL)

(73) Assignees: ASML Netherlands B.V., Veldhoven (NL); Koninklijke Philips Electronics N.V., Eindhoven (NL)

( * ) Notice: Subject to any disclaimer, the term of this patent is extended or adjusted under 35 U.S.C. 154(b) by 584 days.

(21) Appl. No.: 10/792,909

(22) Filed: Mar. 5, 2004

(65) Prior Publication Data
US 2005/0110965 A1 May 26, 2005

(30) Foreign Application Priority Data
Mar. 7, 2003 (EP) .................................. 03075680

(51) Int. Cl.
G03B 27/52 (2006.01)
G03B 27/54 (2006.01)
(52) U.S. Cl. .......................................... 355/55; 355/67
(58) Field of Classification Search ................. 355/53, 355/55, 67–71; 356/399–401; 250/548; 372/26
See application file for complete search history.

(56) References Cited
U.S. PATENT DOCUMENTS

| | | | |
|---|---|---|---|
| 4,697,087 A | 9/1987 | Wu | |
| 5,229,872 A | 7/1993 | Mumola | |
| 5,296,891 A | 3/1994 | Vogt et al. | |
| 5,371,570 A | 12/1994 | Morris et al. | |
| 5,477,057 A * | 12/1995 | Angeley et al. | 250/548 |
| 5,523,193 A | 6/1996 | Nelson | |
| 5,559,601 A | 9/1996 | Gallatin et al. | |
| 5,969,441 A | 10/1999 | Loopstra et al. | |
| 6,297,876 B1 * | 10/2001 | Bornebroek | 355/67 |
| 6,563,565 B2 * | 5/2003 | Nishi | 355/53 |

(Continued)

FOREIGN PATENT DOCUMENTS

EP 1 134 618 A2 9/2001

(Continued)

OTHER PUBLICATIONS

European Search Report dated Aug. 14, 2003.

(Continued)

Primary Examiner—Henry Hung Nguyen
(74) Attorney, Agent, or Firm—Pillsbury Winthrop Shaw Pittman LLP

(57) ABSTRACT

A lithographic apparatus equipped with an improved alignment system, is presented herein. In one embodiment, the apparatus includes a radiation system for providing a projection beam of radiation, a support structure for supporting a patterning device that configures the projection beam according to a desired pattern, a substrate holder for holding a substrate, projection system for projecting the patterned beam onto a target portion of the substrate, and an alignment system. The alignment system includes a radiation source for illuminating at least one mark which is usable for alignment on a substrate and an imaging system for imaging light which has interacted with the at least one mark to generate alignment information.

20 Claims, 7 Drawing Sheets

U.S. PATENT DOCUMENTS

| | | | |
|---|---|---|---|
| 6,901,090 B1 * | 5/2005 | Ohtsuki | 372/26 |
| 2001/0008273 A1 | 7/2001 | Groeneveld et al. | 250/492.1 |

FOREIGN PATENT DOCUMENTS

| | | |
|---|---|---|
| JP | 7-094390 | 4/1995 |
| JP | 8-190202 | 7/1996 |
| JP | 9-113742 | 5/1997 |
| JP | 9-306813 | 11/1997 |
| JP | 2001-281490 | 10/2001 |
| JP | 2002-202462 | 7/2002 |
| WO | WO 98/33096 | 7/1998 |
| WO | WO 98/38597 | 9/1998 |
| WO | WO 98/39689 | 9/1998 |
| WO | WO 98/40791 | 9/1998 |
| WO | WO 02/071142 A1 | 9/2002 |

OTHER PUBLICATIONS

Austrian Search Report issued for Singapore Patent Application No. 200401075-4, dated Jul. 31, 2006.

English translation of Office Action issued in Japanese Patent Appl. No. 2004-061646 dated Mar. 12, 2007.

* cited by examiner

LITHOGRAPHIC ALIGNMENT SYSTEM AND DEVICE MANUFACTURING METHOD

PRIOR INFORMATION

This application claims priority from European Patent Application No. 03075680.3, filed Mar. 7, 2003, herein incorporated by reference in its entirety.

BACKGROUND OF THE INVENTION

1. Field of the Invention

The present invention relates to a lithographic projection apparatus, and in particular, to a lithographic alignment system and an associated device manufacturing method.

2. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning device include:

- a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;
- a programmable mirror array: one example of such a device is a matrix-addressable surface having a visco-elastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the said non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation mechanism. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described here above, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required; and
- a programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as set forth here above.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features.

This array of procedures is used as a basis to pattern an individual layer of a device, e.g. an IC. Such a patterned layer may then undergo various processes such as etching, ion-implantation (doping), metallization, oxidation, chemical-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

It will be appreciated that the ever present demand in lithography to be able to image mask patterns with ever decreasing critical dimension (CD) necessitates increasing overlay accuracy (the accuracy with which two successive layers can be aligned with respect to each other). This drives a need for ever increasing alignment accuracy. Since the overlay error must be much smaller than the critical dimension and the alignment error is not the only contribution to the overlay error, a critical dimension of 90 nm demands an alignment accuracy of 10 nm or less.

SUMMARY OF THE INVENTION

It will be appreciated that known through-the-lens (TTL) alignment systems use linear phase gratings of 16 µm pitch etched onto the substrate which are illuminated by laser light; the diffracted light is then imaged on a reference grating. By scanning the substrate underneath the alignment system and detecting the light passing through the reference grating as a function of stage position, the position of the substrate can be estimated with nanometer accuracy. However, the known TTL alignment system uses one wavelength of laser light and is subject to process dependent errors. Such errors occur when previously produced process layers form diffractive structures affecting the wavelengths used in the alignment system. An alignment system using one wavelength of light is strongly affected by such errors. Introducing a second frequency reduces these errors somewhat by averaging, since the different wavelengths will not be affected in the same way, but does not eliminate them entirely. Such errors can also be caused by asymmetrically deformed alignment marks.

Other conventional alignment systems suffer from various deficiencies. For example, U.S. Pat. No. 5,371,570 discloses a through the lens alignment system using broadband radiation to illuminate alignment marks on the wafer. However, the alignment radiation is produced by a halogen lamp. The beam produced by such a lamp has a low brightness (power radiated divided by surface area lamp and divided by subtended solid angle) therefore it is difficult to obtain a measurement with a high light intensity at the alignment mark, resulting in a low signal to noise ratio (SNR).

U.S. Pat. No. 5,559,601 discloses a through the mask (TTM) alignment system that uses an electromagnetic radiation source providing, e.g. spatially coherent single or multiple discrete wavelengths to illuminate mask and wafer marks. The wafer is scanned relative to the mask and alignment information is derived by Fourier analysis of the intensity of the returning radiation as a function of wafer position.

U.S. Pat. No. 4,697,087 discloses an alignment system having two optical channels or arms, used to detect alignment targets in scribe alleys above and below the mask pattern which are imaged onto the wafer. A portion of the light path used in the two optical channels, or arms, is through the projection optics used to image the mask containing the circuit patterns thereon onto the wafer. This system is referred to as an off-axis through the lens alignment system. The projection optics are designed to perform optimally at the photolithographic actinic wavelengths (i.e. the deep UV) which for obvious reasons cannot be used for alignment. As a result, the performance of the projection optics at the off-axis through the lens alignments systems is somewhat compromised for wavelengths different from the photolithographic actinic wavelengths.

U.S. Pat. No. 5,477,057 discloses an off-axis alignment system that can operate independent of the projection optics, allowing for use of wide band alignment radiation which cannot be used by the monochromatic projection lens system. This also allows for a reduction of wavelength induced errors arising from interference phenomena related to the coherent nature of laser light. With a broadband light source these alignment errors are averaged out. In this alignment system a spot is focused onto the wafer and when the spot hits the edge of an alignment mark the light diffracts from which the position of the edge can be determined.

WO 98/39689 discloses an off-axis alignment system that uses multiple wavelengths and higher diffraction orders to avoid errors resulting from asymmetry of the alignment mark caused by chemical-mechanical polishing. The image of the grating is imaged for each color on a different reference grating to obtain a measurement signal.

While these and other alignment systems have performed adequately for their intended purpose, there is an increasing need for improving the accuracy of alignment systems. This need is particularly evident as the feature size of masks becomes smaller, and the alignment of a wafer therewith becomes critical.

Accordingly, the principles of the present invention, as embodied and broadly described herein, provide for an improved alignment system, in particular one which allows for the use of smaller alignment marks. In one embodiment, a lithographic projection apparatus is presented, comprising a radiation system for providing a projection beam of radiation, a support structure for supporting a patterning device that configures the projection beam according to a desired pattern, a substrate holder for holding a substrate, projection system for projecting the patterned beam onto a target portion of the substrate, and an alignment system comprising a radiation source for illuminating a substrate held by said substrate holder having at least one mark which is usable for alignment and an imaging system for imaging light which has interacted with the at least one mark.

In one embodiment, the radiation source comprises a first mechanism for producing a ray of coherent light, such as, for example, laser or laser-like light with a high brightness and a first wavelength spectrum which is relatively narrow and second mechanism for guiding the ray and generating within substantially the dimensions of the ray light with a second wavelength spectrum that is substantially broader than the first wavelength spectrum.

Such a radiation source produces generally a narrow ray of coherent light, such as, for example, laser or laser-like light (i.e. light with spatial coherence properties comparable to those of a laser). In other words, the first mechanism generally comprise a "point source" with a high brightness or any other source with a high spatial coherence. A relatively narrow wavelength spectrum may show intensity at only one or a few wavelengths. A broader spectrum shows intensity at a much larger number of wavelengths. This radiation source being capable of producing a point source of light with a high brightness and a broad spectrum of wavelengths, allows for both reduction of wavelength induced errors arising from interference phenomena and a high S/N ratio due to the high intensity of light interacting with an alignment mark.

It will be understood that "high brightness" means that the brightness should at least be sufficient to induce in the second mechanism non linear effects which will be referred to later and allow further for use of the light in the alignment system. It applies in particular that the light produced by the radiation source has a brightness which is high enough to carry out the alignment the system is intended for. Such a brightness is at least similar to the brightness of a source used in the prior art and preferably similar to the brightness of the light produced by the first mechanism.

In the present application, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm, as well as particle beams, such as ions beams or electron beams. The term ray is used for beams which exclusively comprise electromagnetic radiation produced in the method of alignment.

As stated before, the lithographic apparatus according to the invention uses light which provides, after interaction with alignment marks, reliable information due to the high signal to noise ratio of the imaged light. This allows for reliably determining the (relative) position of the substrate.

The radiation source according to the invention further allows for the use of smaller fields (containing the same light intensity) in the alignment system. On its turn, this allows for smaller alignment marks on the substrates, leaving for instance more silicon on a substrate to be used for the manufacture of an IC.

Also compared to the use of a conventional lamp in a method of alignment using such small alignment marks, the signal to noise ratio, obtained with a radiation source as used in a lithographic apparatus according to the invention, has improved significantly. This allows for the use of more simple, cheaper and probably more robust detectors in the imaging system.

Furthermore, an alignment system of a lithographic apparatus according to the invention, i.e. provided with such a radiation source, can be designed to have a low étendue (solid angle subtended by a ray multiplied by the area of cross-section of the ray) and still a high signal to noise ratio. A low étendue design of the optics of the alignment system diminishes the demands on the lenses, allowing for a simpler lens design.

A low étendue also reduces the focus dependency of the alignment system ultimately leading to a more reliable alignment.

Another advantage of the alignment system in the lithographic apparatus according to the invention concerns the "photon-budget". Less light is needed to obtain sufficient information compared to the light needed in a conventional apparatus.

In a preferred embodiment the first mechanism comprises a laser. Lasers are widely available and relatively easy to incorporate in the alignment system.

It is further preferred that the laser comprises a pulsed laser. According to a rough approximation, the width of the wavelength band of the light produced with such a laser is inversely proportional to the time span of the pulse. In other words, the first wavelength spectrum may be broadened itself by using short pulses of laser or laser-like light.

The second mechanism may comprise an optical fiber. Through such a fiber light is guided. The light-guiding part may have a diameter of the order of microns, allowing the fiber tip to serve as a "point source".

It is further preferred that the fiber comprises a core extending in the axial direction of the fiber. The core of this fiber is substantially surrounded by a medium with an index of refraction which is lower than the index of refraction of the core. This allows light to be guided by internal reflection of the core-medium interface.

Preferably, the fiber comprises at least one channel. Each channel extends substantially into the axial direction of the fiber. The core itself is free from any channels extending substantially into the axial direction of the fiber. If there is one channel, preferably, this channel substantially surrounds the core. The core is then held in its place by a connection between the core and the part of the fiber which surrounds the channel. If there are more channels, the channels are arranged such that the core is surrounded by the channels. The fiber parts between the channels form a connection between the core and the part of the fiber that surrounds the plurality of channels, holding the core in its place. The channel or channels surrounding the core may be filled with air or any other suitable gas as the medium. The medium may be a vacuum. The differences between the refractive index of the core and the surrounding may in that case approach 0.45, when a silica core is used. It is of course also possible that the channels are vacuumized. The core may have diameter of the order of a micron. In such a fiber light propagates in a single mode and a number of non-linear optical effects occur at visible wavelength, giving rise to an enormous broadening of the wavelengths spectrum of the light.

Alternatively, or additionally, the fiber is along the axial direction of the fiber provided with at least one taper. A taper may be formed by heating the optical fiber for instance in a flame and stretching it to such an extent that the fiber obtains a waist diameter of about one or a few microns. In this case the waist, i.e. the core, is also surrounded by a medium such as air or a vacuum. Physically, this is substantially similar to the embodiment in which the core is surrounded by one or more channels.

The combined effects of many non-linear phenomena occurring in the long length of the fiber produce light with a broad spectrum, substantially flat in shape. This light has the properties of an ultra broadband single mode optical continuum. It is then possible that, the second wavelength spectrum corresponds substantially to a wavelength spectrum of white light.

The alignment be configured as an off-axis alignment system. This allows for a more convenient implementation of the invention In a particular embodiment of the invention, the imaging system is arranged to image onto one single image plane substantially correctly at least two distinct wavelengths light which is diffracted from a phase grating on the substrate.

According to another embodiment, there is provided a device manufacturing method comprising providing a substrate that is at least partially covered by a layer of radiation-sensitive material, providing a projection beam of radiation using a radiation system, using patterning means to endow the projection beam with a pattern in its cross-section, projecting the patterned beam of radiation onto a target portion of the layer of radiation-sensitive material, and aligning the substrate using alignment system. The method further comprises illuminating on a substrate at least one mark which is usable for alignment and imaging light which has interacted with the at least one mark and producing a ray of laser or laser-like light with a high brightness and a first wavelength spectrum which is relatively narrow, guiding the ray, and generating substantially within dimensions of the ray light with a second wavelength spectrum that is substantially broader than the first wavelength spectrum.

According to another embodiment of the invention, there is provided an alignment system for in an apparatus which reproducibly modifies substrates successively held on a substrate table, the system comprising a radiation source for illuminating on a substrate held on said substrate table at least one mark which is usable for alignment and an imaging system for imaging light which has interacted with the at least one mark, characterized in that, the radiation source comprises first mechanism for producing a ray of laser or laser-like light with a high brightness and a first wavelength spectrum which is relatively narrow and second mechanism for guiding the ray and generating substantially within dimensions of the ray light with a second wavelength spectrum which is substantially broader than the first wavelength.

It should be explicitly understood that an apparatus, which reproducibly modifies substrates successively held on a substrate table may for instance also be a printing machine.

Although specific reference may be made in this text to the use of the lithographic apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

BRIEF DESCRIPTION OF DRAWINGS

Embodiments of the invention will now be described, by way of example only, with reference to the accompanying schematic drawings in which corresponding reference symbols indicate corresponding parts, and in which.

In the Figures, corresponding reference symbols indicate corresponding parts.

DETAILED DESCRIPTION OF THE INVENTION

Lithographic Apparatus

Figure 1:
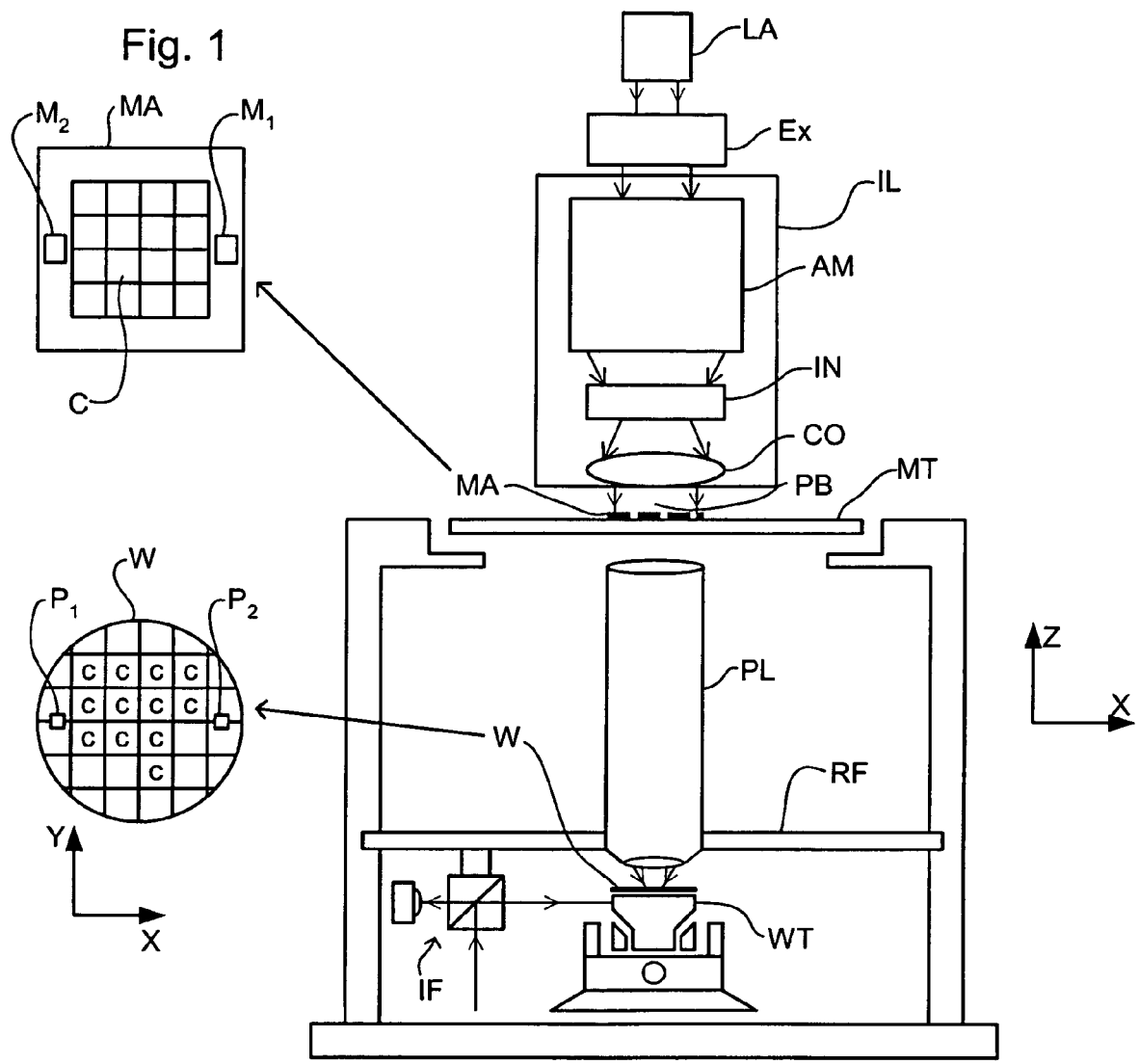
FIG. 1 depicts a lithographic projection apparatus according to an embodiment of the invention.

FIG. 1 schematically depicts a lithographic apparatus according to a particular embodiment of the invention. The apparatus comprises:

a radiation system Ex, IL: for supplying a projection beam PB of radiation (e.g. UV radiation). In this particular case, the radiation system also comprises a radiation source LA;

a first object table (mask table) MT: provided with a mask holder for holding a mask MA (e.g. a reticle), and connected to first positioning mechanism PM for accurately positioning the mask with respect to item PL;

a second object table (substrate table) WT: provided with a substrate holder for holding a substrate W (e.g. a resist-coated silicon wafer), and connected to second positioning mechanism PW for accurately positioning the substrate with respect to item PL; and a projection system ("lens") PL: for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. a mercury lamp or an excimer laser) produces a beam of radiation. This beam is fed into an illumination system (illuminator) IL, either directly or after having traversed conditioning mechanism, such as a beam expander Ex, for example. The illuminator IL may comprise adjusting mechanism AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

step mode: the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure;

scan mode: the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion; and other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Embodiments

Figure 2:
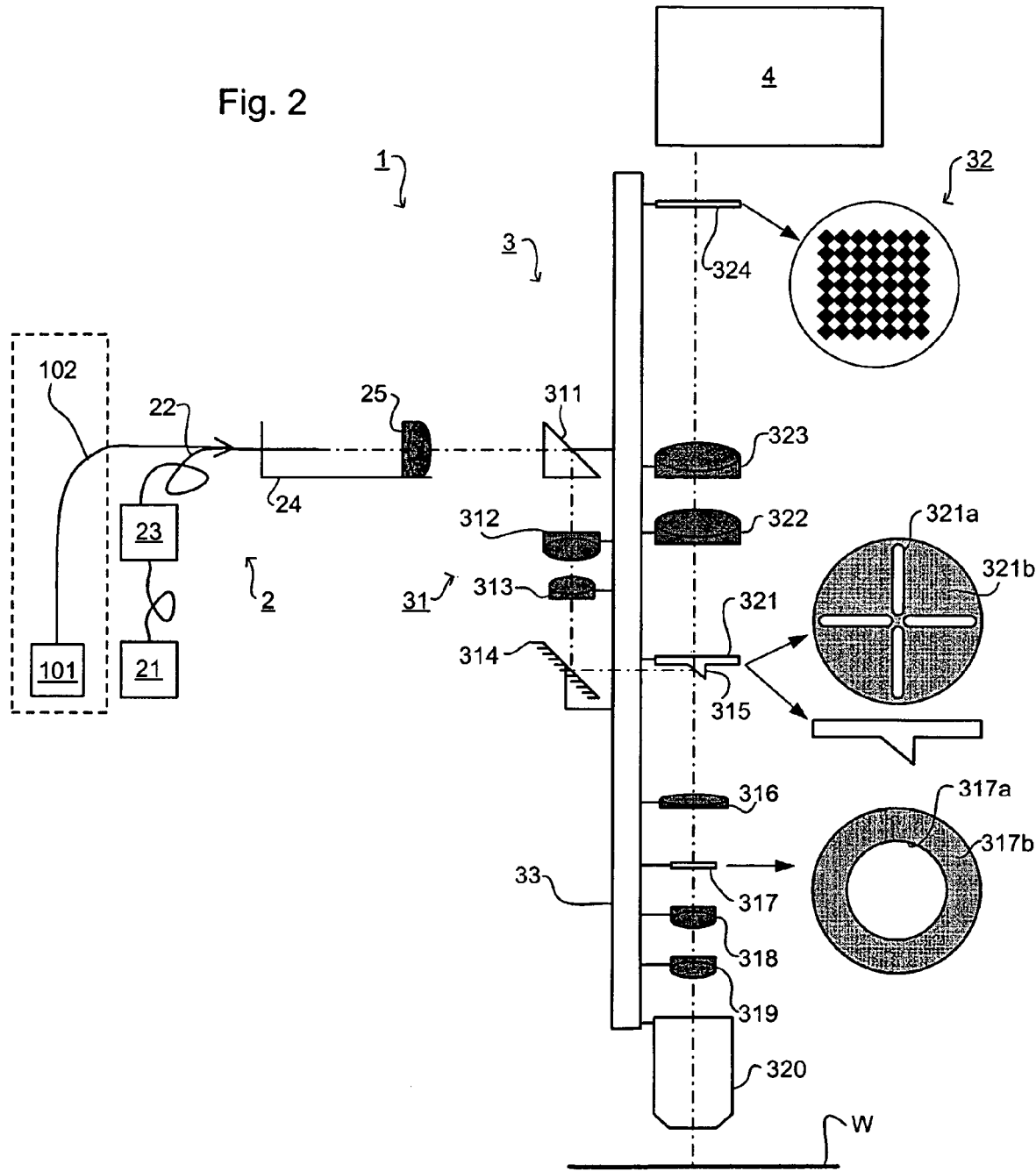
FIG. 2 is a diagram of the imaging section of an alignment system according to a first embodiment of the invention.

An off-axis alignment system forming part of the first embodiment of the present invention is shown generally in FIG. 2. The alignment system 1 comprises source module 2, optical module 3 and detection module 4.

Source module 2 comprises a broadband source 21 with a low étendue, which is described further below, and which outputs broadband radiation, e.g. in the visible region, into a multi-mode fiber 22. Interposed in the multi-mode fiber 22 is a homogenizer 23, also described further below. The output end of multi-mode fiber 22 is held in bracket 24 which also mounts lens 25. Lens 25 feeds the illumination light into the illumination branch 31 of the optical module 3. The illumination branch 31 comprises lenses 312, 313 which, together with lens 25 of the source module 2, focus the output end of the fiber with a magnification of about 5 onto a small 45° mirror 315 which folds the beam into the imaging branch 32 of the optical module 3. Mirrors 311 and 314 are provided in the illumination branch 3 for convenient folding of the beam. Bracket 24 allows the end of fiber 22 and lens 25 to be positioned in three dimensions for accurate positioning of the source image.

Starting from the bottom, the imaging branch 32 comprises a high numerical aperture (NA), long working distance microscope objective 320. Next are two field lenses 319, 318 that re-image the wafer W onto the first intermediate image plane at which field stop 317 is provided. Lenses 318, 319 are arranged such that the first part of the imaging system is telecentric on both image and object side, with a magnification of exactly 30.

At a pupil plane, spatial filter 321 is provided—this has an opaque center and apertures 321a extending parallel to the X and Y directions to select only the orders diffracted in the X and Y directions, i.e., not those diffracted by the diagonal structures in the mark and not the $0^{th}$-order. This part of the imaging system is telecentric on the object side (field stop 317) but not the image side, where reference mark 324 is provided. This enables the overall length of the system to be reduced. The lenses 322, 323 are selected and positioned so that the total magnification of the imaging system from the wafer to the plane of the reference mark 324 is exactly 50. The magnification of the second part of the imaging branch is therefor 1⅔.

It will be appreciated that the magnification of the imaging system is related to the pitches of the substrate mark and reference grating. Because the $0^{th}$-order is blocked, the pitch of the substrate mask $P_{substrate}$, the magnification M and the pitch of the reference grating $P_{ref}$ must satisfy the following equation:

$$P_{ref} = \frac{1}{2} \cdot M \cdot P_{substrate}$$

The components of the optical module 3 are preferably rigidly mounted to a frame 33 made of an ultra low expansion material such as Invar or Zerodur and mounted on the reference frame of the apparatus.

The microscope objective 320 forms the first lens of the imaging branch of the optical module and is one of the most important components in the alignment system. This lens must have a numerical aperture large enough to capture sufficient diffraction orders from the alignment mark on the wafer and may, for example, have a numerical aperture of at least 0.8 or 0.9.

It may be preferred to have a reasonable distance between the wafer and alignment system so that a long working distance objective is preferred. Commercially available microscope objectives are usable. The arrangement illustrated in FIG. 2 makes use of a microscope objective that does not have an accessible pupil plane. Accordingly, lenses 318, 319, 316 are provided to re-image the pupil plane at a physically accessible location where a pupil stop 321 can be provided. A more compact arrangement may be obtained if a microscope objective having a physically accessible pupil plane is used. Suitable objectives are known for use in phase contrast microscopes.

As will be appreciated, the basic principle of the alignment system is that an alignment mark provided on the wafer is imaged onto a corresponding reference mark provided in the system and alignment information is derived from measuring the intensity of radiation passing through the reference grating as the wafer is scanned. In the present invention, the reference mark comprises a two-dimensional grating having diamond-shaped unit cells, as shown in the enlargement in FIG. 2. The reference mark 324 is arranged to be symmetric around the optical axis of the imaging branch of the alignment system. This symmetry suppresses the influence of chromatic magnification errors on the aligned position. Since a change of magnification causes symmetric distortions, the errors on both sides of the optical axis cancel each other out, at least for small magnification errors. The use of a two-dimensional grating enables detection of alignment in both X and Y directions whilst preserving complete symmetry around the optical axis. Note though that the alignment marks on the wafer are still linear gratings and that only one direction is measured at a time.

The field stop 317 is positioned at the first intermediate image of the wafer and thereby serves as the field stop for both illumination and imaging. The imaging field can be further reduced by placing an additional field stop at the position of reference mark 324. To minimize the effects of clipping of the field, the field aperture 317a is circular. Acting as field stop of the imaging system, the field stop 317 determines the area of the mark that is detected.

In the present invention, the detection field is smaller than the total mark size so that the detection field can remain within the mark during the scan of the alignment mark. This means there is no envelope in the intensity of the alignment signal, improving fitting in the detection system. Acting as field stop for the illumination branch, field stop 317 limits the field of illumination to be only slightly larger or identical to the detection field. This avoids the possibility that structures adjacent the alignment mark are also illuminated, which might lead to stray diffraction entering the imaging system and causing errors in the alignment signal.

Figure 3:
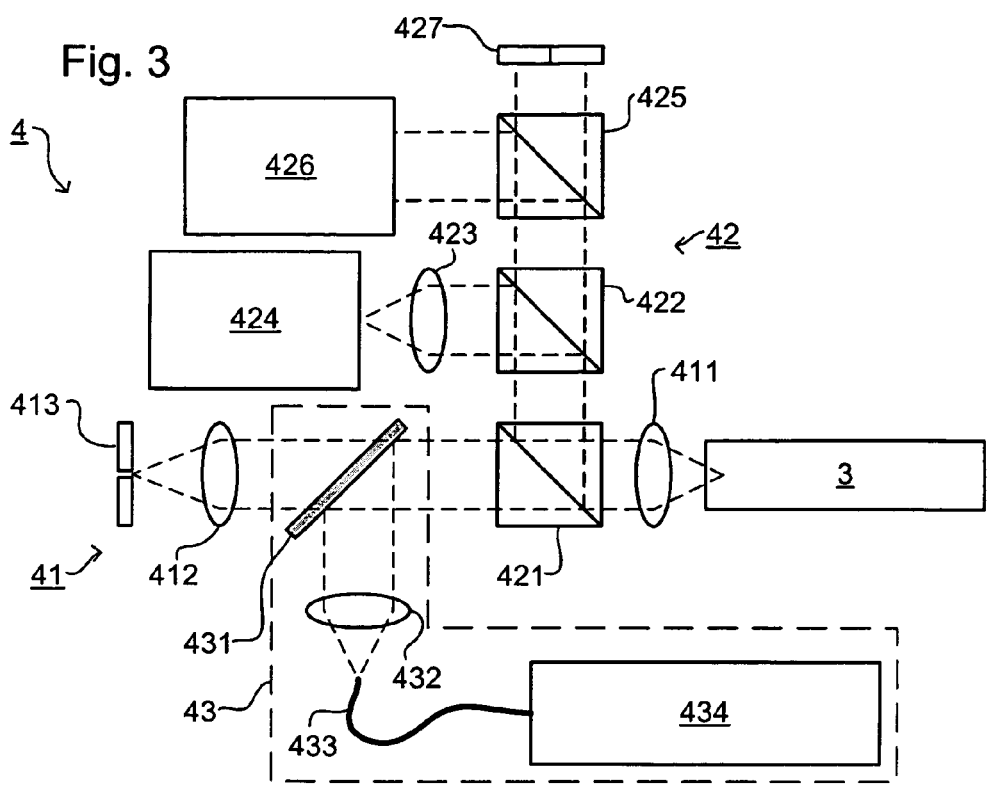
FIG. 3 is a diagram of the detection section of the alignment system according to the first embodiment of the invention.

Detection module 4 primarily measures the intensity of the light transmitted through the reference mark 324 that is located in an image plane of the system. The detection module also detects the focus signal and provides camera images of both the pupil plane and the wafer plane. The detection module 4 is shown in more detail in FIG. 3.

Figure 4:
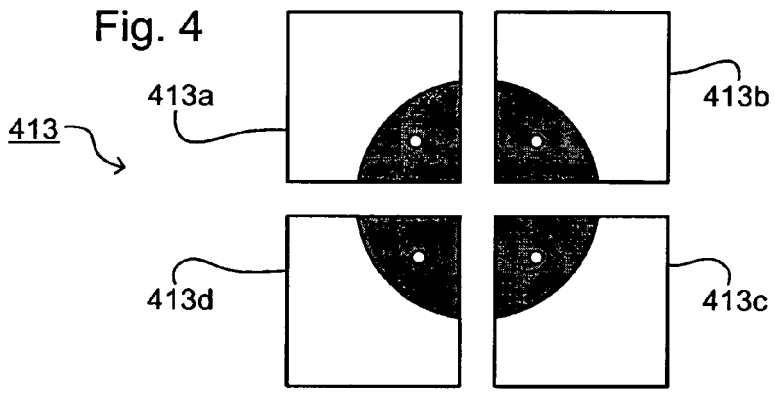
FIG. 4 is a diagram of a quad cell sensor used in the alignment system according to the first embodiment of the invention.

The main signal detection branch 41 of the detection module 4 comprises lenses 411, 412 which image the circular field of the alignment system on the center of a quad cell 413. The quad cell 413 has four sections 413a, b, c, d (shown in FIG. 4) so that four different points (shown by open circles) in the field can be measured. Each cell of the quad cell 413 is a silicon photodiode. The intensity detected by the cells of the quad cell is a sine function of substrate table position with which alignment can be carried out in a known manner. The exact position of the effective measurement point is dependent on the intensity distribution over the field and in general the layout of the photodiode and the shape of the field. Measuring at four points simultaneously provides advantages that the relative magnification and rotation of the reference grating with respect to the wafer grating can easily be determined from one alignment scan. This enables rapid initial alignment of the module and long-term monitoring of the performance of the alignment system.

A second, optional, signal detection branch 43 comprises a half-silvered mirror 431 to divert a proportion of the detection beam and lens 432 which gathers the light and couples it into a multi-mode fiber 433 which transports it to a photo-multiplier tube 434 conveniently arranged in the electronics module of the apparatus. The photo-multiplier is used for detection of very weak alignment marks since it can do shot noise limited detection and noiseless amplification of the alignment signal.

Camera branch 42 comprises beams splitters 421, 422 and 425 as well as lens 423 which divert light onto CCD cameras 424, 426 placed respectively at image and pupil planes of the detection module and to split detector 427.

Figure 5:
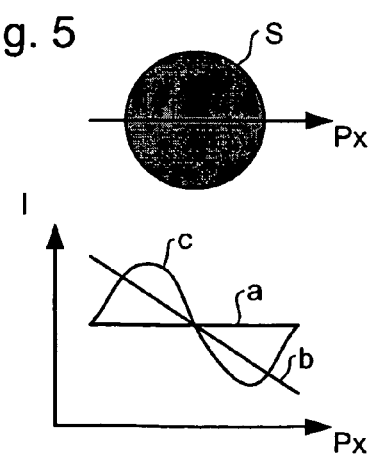
FIGS. 5 and 6 are diagrams used in explaining detection of correct focus in the alignment system.
Figure 6:
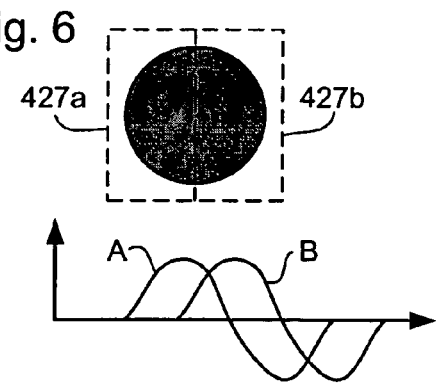

Split detector 427 is placed in a pupil plane of the reference mark 324. In this plane, there will be diffraction spots at a separation determined by the period of the substrate and reference gratings and a size determined by the aperture of the imaging system 3. If the imaging system 3 is in focus, i.e., the substrate and reference gratings are in conjugate planes, the intensity distribution in the spots will be homogeneous. However, defocus will cause inhomogeneities. This is shown in the graph of FIG. 5 which shows intensity with x position in the pupil plane. Horizontal straight line a is for a system in correct focus, inclined straight line b is for a system with slight defocus and sinusoidal curve c is for a system with a larger degree of defocus. If the gratings are scanned in the x-direction, the intensity profile will show a phase shift between the two halves of the photo detector, if the system is out of focus.

This arrangement can also be used with a detector divided into a greater number of segments. The above method of detecting defocus depends on height to the diffraction grating on the substrate and hence is not affected by subsequent process layers.

An alternative way to detect the focus signal makes use of the fact that the apparent aligned position is dependent on the angle of illumination of the alignment mark when it is not properly focused. A split detector placed in the image pupil of the alignment system after the reference grating enables the apparent aligned position to be measured separately using beams that have a positive angle of incidence and beams that have a negative angle of incidence. The difference in apparent aligned position therefore indicates the degree of defocus.

It should be noted that the alignment signal is taken from the first orders coming from the reference grating and accordingly these orders are isolated from the remainder of the light by a pupil filter (not shown) provided in the pupil plane of the detection module.

The above alignment system is designed to receive light via a multi-mode fiber 22 and can use light in a broad wavelength range so that many different forms of light source 21 can be used. Additionally, the light is preferably modulated, e.g. at 50 kHz, in a known manner to enable synchronous detection.

Figure 7:
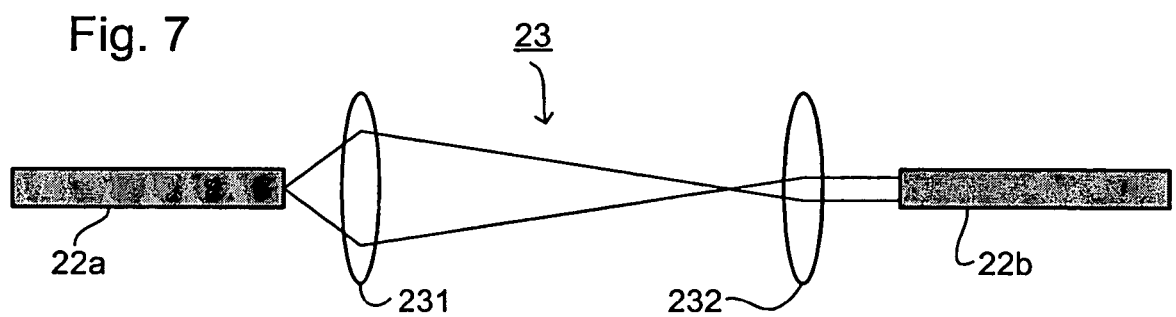
FIG. 7 is a diagram of a homogenizer used in the alignment system according to the first embodiment of the invention.

To provide a desired angular homogeneity, homogenizer 23 is provided in multi-mode fiber 22 which brings the illumination light from source 21. The multi-mode fiber 22 provides sufficient spatial homogeneity but retains any angular inhomogeneity of the source even for a 5 m long fiber. Homogenizer 23, as shown in FIG. 7, comprises lenses 231, 232 arranged such that fiber entrance of the output fiber 22b is located in the pupil plane of the optical system formed by lenses 231, 232. This effectively swaps the spatial and angular coordinates so that both the angular and spatial coordinates are homogenized by the two sections 22a, 22b of the multi-mode fiber 22 without introducing significant losses.

Figure 8:
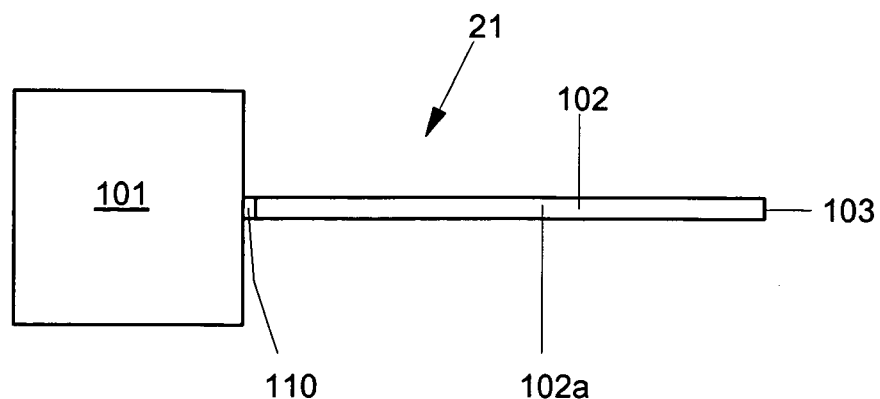
FIG. 8 a diagram of a light sources usable in any embodiment of the invention.

An example of a radiation source 21 usable in this and other alignment systems is shown in FIG. 8. The radiation source comprises a first mechanism 101 for producing a ray of coherent light, such as, for example, a laser or laser-like light with a high brightness and a first wavelength spectrum which is relatively narrow. The radiation source further comprises a second mechanism 102 into which light from the first mechanism 101 is directed for guiding the ray and generating within dimensions of the ray light with a second wavelength spectrum that is substantially broader than the first wavelength spectrum.

The first mechanism may comprise a laser, such as a Titanium-Sapphire laser which generates in operation for instance light pulses of 100 fs duration with an energy of 800 pJ and a wavelength of 790 nm. The light is directed into an optical fiber 102a. To prevent optical feedback into the laser, an optical isolator 110 may be used. An output end 103 of the optical fiber 102a forms in use a "point source". From this point source 103 the light is further directed such that the light eventually illuminates the at least one alignment mark present on the substrate. This may occur as outlined above. However, other suitable routes may be explored as well.

In an alternative embodiment the radiation source 21 feeds light directly into the illumination system, i.e. without passing a homogenizer 23. In that case, the fiber 22 (FIG. 2) is a single mode fiber, and may correspond with fiber 102a (FIG. 8). This alternative is shown in FIG. 2 within the box with the dashed lines.

Figure 9:
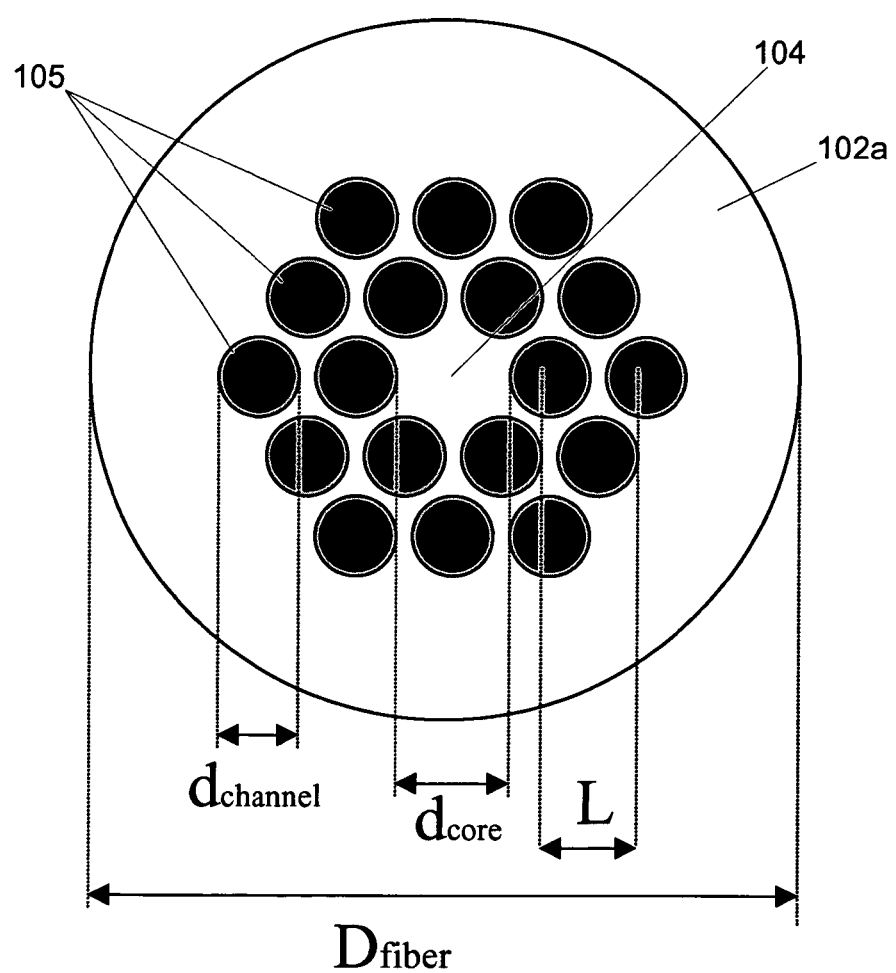
FIGS. 9, 10, 11 and 12 cross sections of a fiber usable in a light source schematically shown in FIG. 8.

As shown in FIG. 9 the fiber 102a generally comprises a core 104 extending in the axial direction of the fiber 102a. The core 104 of this fiber 102a is substantially surrounded by a medium with an index of refraction which is lower than the index of refraction of the core 104. This allows light to be guided by internal reflection of the core-medium interface. Possible cross sections of such a fiber 102a are shown in FIG. 9, 10, and 11.

FIG. 9 shows a cross-section of a fiber with a plurality of channels 105 extending in the axial direction of the fiber 102a. The core 104 itself is free from any channels extending substantially into the axial direction of the fiber 102a. The channels are in this example arranged in a hexagonal closed packed configuration. Generally, the core has a diameter $d_{core}$ in the order of a micron. The channels have each a diameter $d_{channel}$ which corresponds more or less to the diameter of the core. The ratio of the diameter of a channel $d_{channel}$ to the channel to channel pitch (L) is preferably between 0.4 and 0.8. A gas, such as air, or a vacuum will be present in the channels. Hence, the volumes defined by the channels will have an index of refraction which is lower than the index of refraction of the core.

Figure 10:
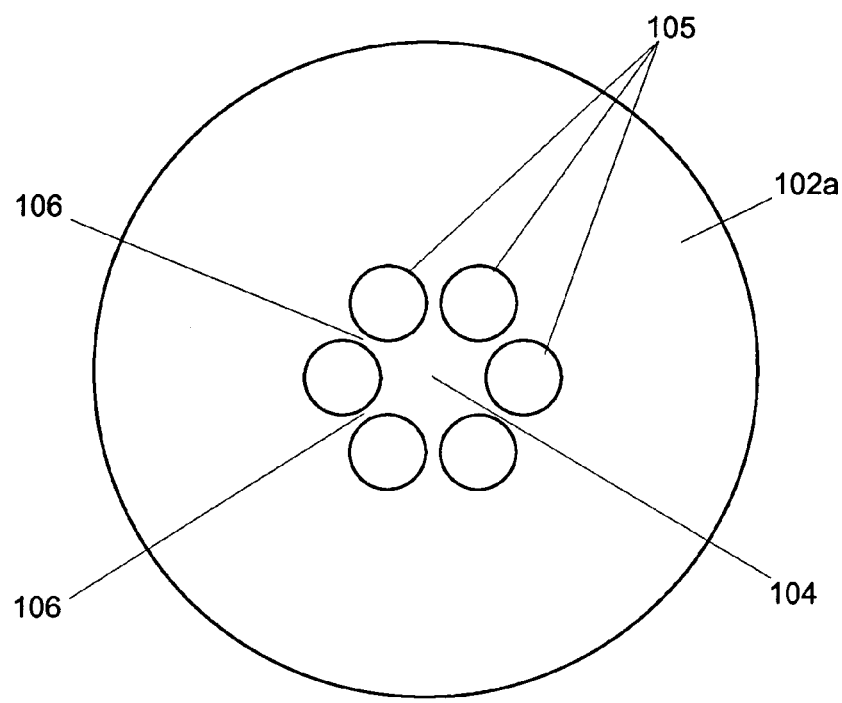

FIG. 10 shows a cross-section of a fiber 102a with one ring of channels 105 extending the in the axial direction of the fiber 102a. The channels may be filled with gas. The fiber parts 106 between the channels form a connection between the core 104 and the part of the fiber that surrounds the plurality of channels. The fibers part 106 hold the core in place. The performances of a fiber with a cross section as shown in FIG. 9 and of a fiber with a cross section as shown in FIG. 10 are substantially similar, if not equal.

Figure 11:
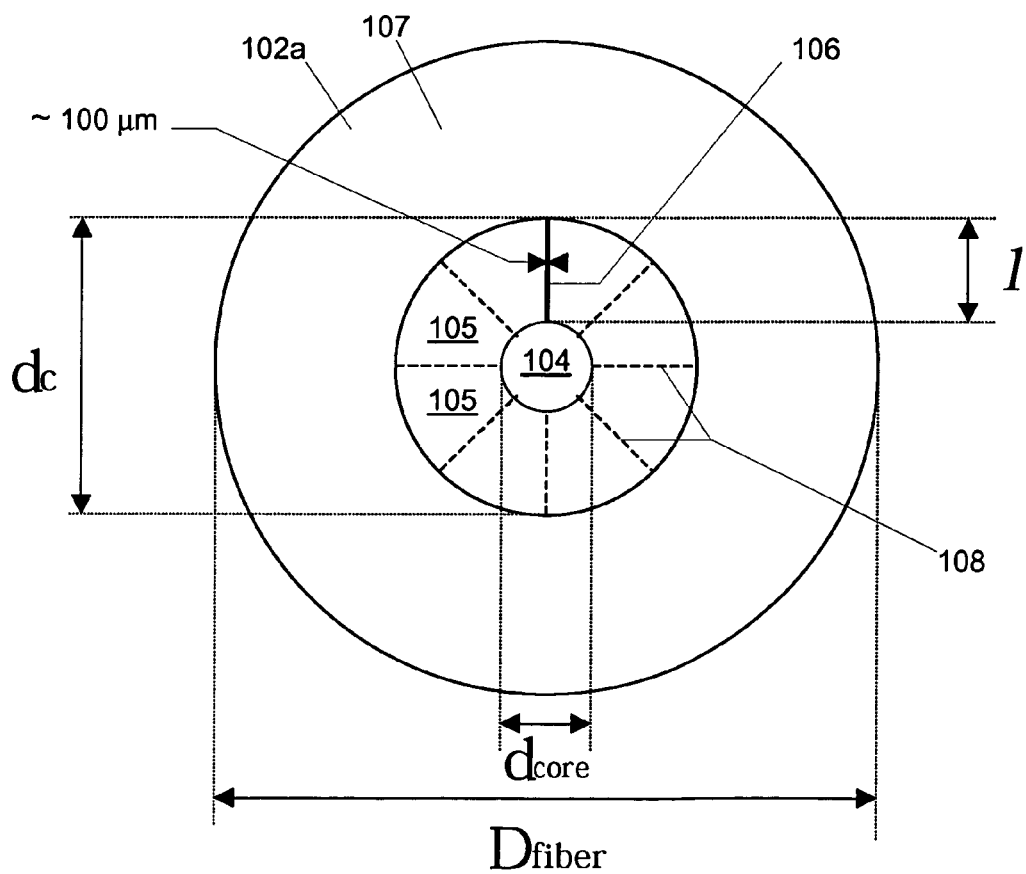

FIG. 11 shows as another alternative of a cross section of a fiber 102a comprising one channel 105 surrounding the core 104. The core 104 is then held in its place by a connection 106 between the core and the part 107 of the fiber 102a which surrounds the channel 105. It is possible that the fiber comprises more connections to hold the core in its place. This is indicated by the dotted connections 108. In that case, the fiber 102a comprises of course more channels 105. It is also possible that the core is surrounded by a first ring of channels and that the first ring of channels is surrounded by a second ring of channels. In a fiber with a cross-section as schematically shown in FIG. 11, the connections 106, 108 may be as thin as about 100 nm. The length of the connections 106, 108 may be about 5 micron. The core diameter $d_{core}$ may be in the order of a micron. The diameter $d_c$ of the channel 105 surrounding the core may be about 7 micron.

With reference to FIG. 9, 10 or 11, the channel or channels surrounding the core may be filled with a gas such as air, acting as the medium. It is also possible that the channels comprise a vacuum as the fiber may be placed itself in a vacuum environment. The core may be of silica. Also the parts 106, 108 between the channels 105 and the part 107 may be of silica. The core preferably has a diameter $d_{core}$ of the order of a micron. The differences between the refractive index of the core and the surrounding medium may in that case approach 0.45.

In such a fiber, light propagates in a single mode and a number of non-linear optical effects occur allowing for the generation of light with a much broader wavelength spectrum than the wavelength spectrum of the light directly produced by the laser 101. By injecting pulses of 100 fs duration, 800 pJ energy and a center wavelength of 790 nm into a 75 cm long section of such a fiber, light with a continuum extending from 390 to 1600 nm is created. The combined effects of many non-linear phenomena occurring in the long length of the fiber produce light with a broad spectrum, substantially flat in shape. This light has the properties of an ultra broadband single mode optical continuum. It is then possible that, the second wavelength spectrum corresponds substantially to a wavelength spectrum of white light. The non-linear effects possibly include Raman scattering, self-phase modulation, second harmonic generation, four-wave mixing.

A fiber as shown in FIG. 9, 10 or 11 may be produced by stacking pure-silica capillaries around a solid-silica rod. The stack is then drawn down into a fiber. A solid-silica jacket is usually added to increase the external fiber diameter to a diameter of 60 up to 100 micron for ease of handling.

With different stacking and drawing techniques fibers with various channel diameters $d_{channel}$, channel to channel pitches L, and solid core diameters $d_{core}$ are fabricated.

Figure 12:
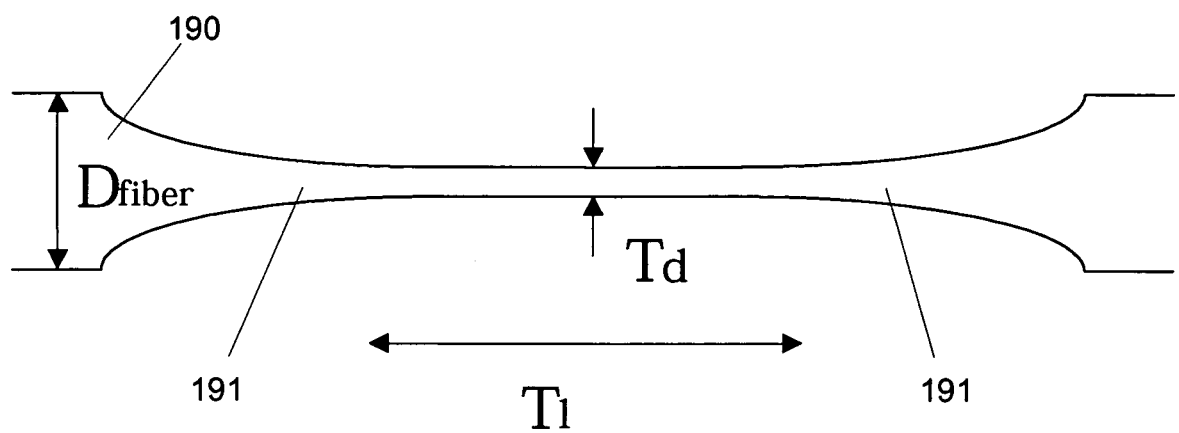

FIG. 12 shows an alternative fiber 190 of a radiation source as used in a lithographic apparatus according to the invention. In this case the fiber 190 is provided with tapers 191 along the axial direction of the fiber. This may be formed by heating a conventional optical fiber and stretching the fiber, for instance in a flame. The diameter of the fiber is then reduced to such an extent that the core becomes too small to confine the light.

A traveling-flame technique may be used to produce tapers with short transitions regions and a uniform-diameter waist region with a length $T_1$ in the order of 100 mm. It is also possible to obtain and use waist controlled variations in the diameter and fused taper couplers. The tapers are usually placed in a housing for physical protection and to prevent losses caused by the dust setting the waist region. In this case the waist, i.e. the core, is also surrounded by a medium such as air, or placed in a vacuum. Physically this is substantially similar to the embodiment in which the core is surrounded by one or more channels. A fiber tapered in this way to a waist diameter $T_d$ of about one or a few microns is capable of generating light with a broad wavelength spectrum if light with a relatively narrow wavelength spectrum is guided through the fiber. By scaling the fiber dimensions for larger or smaller core diameters, a fiber with zero GVD (Group Velocity Dispersion) is possible for light with a wavelength anywhere between 650 nm and 1300 nm.

FIG. 12 shows schematically the intensity of the first wavelength spectrum I and the second wavelength spectrum II as producible with fibers shown in FIG. 9-12.

Figure 13:
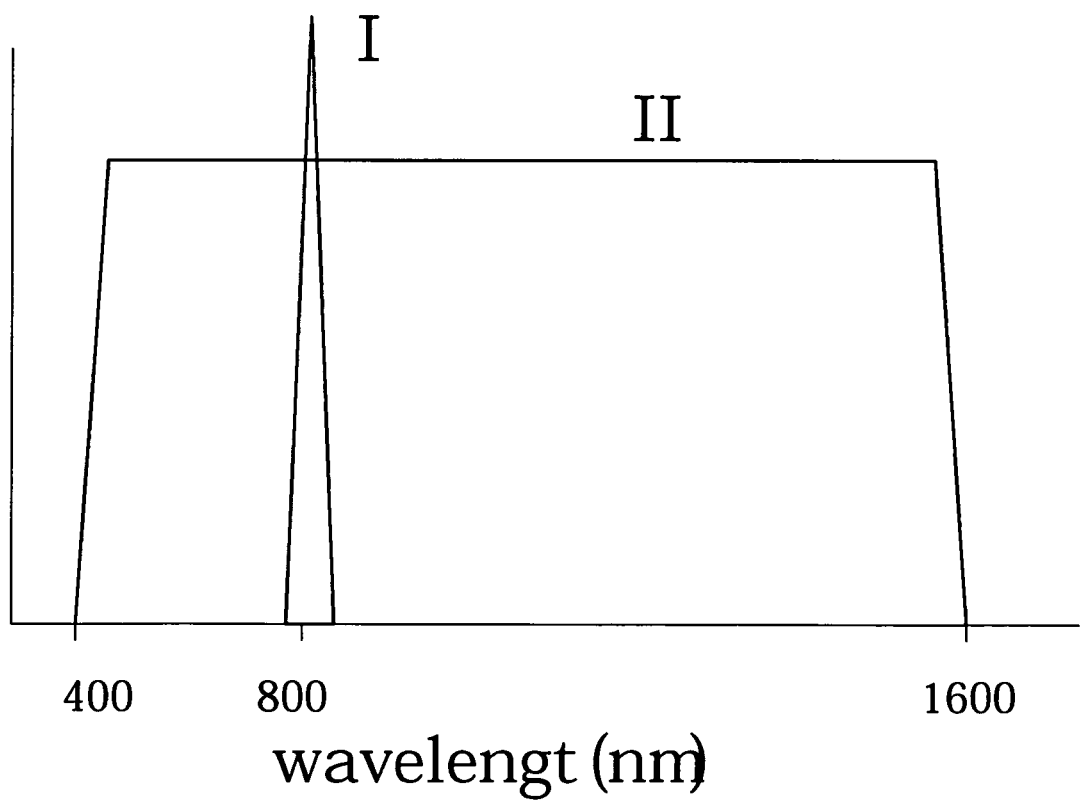
FIG. 13 a schematic presentation of the first wavelength spectrum and the second wavelength spectrum according to the invention.

It should be noted that the shape of the second wavelength spectrum II in FIG. 13 is a very rough simplification. Generally, the broadest spectra are seen when the wavelength of the laser is much larger than the wavelength at which the fiber shows a GVD equal to zero. The flatness of the second wavelength spectrum as well as the width further depends on the power used and the length of the fiber. In particular it applies that the broad wavelength spectrum overlaps with the narrow wavelength spectrum. More information related to the generation of light with a broad spectrum when light with a less broad spectrum is guided into a fiber, is described by Wordsworth et al in J. Opt. Soc. Am. B/vol. 19, No. 9/Sept. 2002, incorporated herein by reference.

Although so far, only fibers produced of silica have been described, it is conceivable that also fibers produced of other materials, including polymers, may be of use on second mechanism for guiding light and generating light with a broad wavelength spectrum.

The apparatus may also comprise an alignment system as described in U.S. Pat. No. 5,477,057, incorporated by reference. Also other lithographic apparatus not mentioned in this specification may be constructed according to the invention. The apparatus according to the invention may also in these embodiments be provided with a radiation sources of which a schematic representation is shown in FIG. 8 and of which a possible cross section of the fiber is shown in either FIG. 9, 10, 11 or 12.

It should further be noted that the radiation source as described may also be incorporated in an alignment system for an apparatus which reproducibly modifies substrates successively held on a substrate table. Such an alignment system is understood to fall within the scope of the invention.

Whilst specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A lithographic apparatus comprising:
a support structure configured to support a patterning device, the patterning device arranged to configure a beam of radiation in accordance with a desired pattern;
a substrate holder configured to hold a substrate;
a projection system configured to project said patterned beam onto a target portion of the substrate; and
an alignment system comprising:
a radiation source configured to illuminate at least one mark on said substrate that is usable for alignment, said radiation source including a first mechanism configured to generate a coherent ray of light having a first wavelength spectrum which is narrow and a second mechanism that is configured to guide said ray of light, said second mechanism having a second wavelength spectrum that is broader than said first wavelength spectrum, and
an imaging system configured to image light which has interacted with said at least one mark to provide alignment information.

2. The lithographic apparatus of claim 1, wherein said first mechanism comprises a laser.

3. The lithographic apparatus of claim 2, wherein said laser comprises a pulsed laser.

4. The lithographic apparatus of claim 1, wherein said second mechanism comprises an optical fiber.

5. The lithographic apparatus of claim 4, wherein said fiber comprises a core extending in the axial direction of the fiber, the core being substantially surrounded by a medium with an index of refraction which is lower than the index of refraction of the core.

6. The lithographic apparatus of claim 5, wherein said fiber comprises at least one channel, each channel extending substantially along the axial direction of the fiber with said core being free from any channels extending substantially into the axial direction of the fiber.

7. The lithographic apparatus of claim 6, wherein said fiber comprises a plurality of channels that are arranged in a hexagonal close packed configuration.

8. The lithographic apparatus of claim 7, wherein each of said channels has a diameter which is of the order of the diameter of said core.

9. The lithographic apparatus of claim 7, wherein a ratio of the diameter of a channel to a channel pitch is between 0.4 and 0.8.

10. The lithographic apparatus of claim 6, wherein said at least one channel is filled with a gas or comprises a vacuum.

11. The lithographic apparatus of claim 5, wherein said fiber comprises at least one taper along the axial direction.

12. The lithographic apparatus of claim 1, wherein said second wavelength spectrum corresponds substantially to a wavelength spectrum of white light.

13. The lithographic apparatus of claim 1, wherein said alignment system is arranged as an off-axis alignment system.

14. The lithographic apparatus of claim 1, wherein said imaging system is configured to image onto one single image plane at least two distinct light wavelengths which are diffracted from a phase grating on said substrate.

15. An alignment system for use in an apparatus which reproducibly processes substrates held on a substrate table, said alignment system comprising:
a radiation source configured to illuminate at least one mark on said substrate that is usable for alignment, said radiation source including:
a first mechanism configured to generate a coherent ray of light having a first wavelength spectrum which is narrow, and
a second mechanism that is configured to guide said ray of light, said second mechanism having a second wavelength spectrum that is broader than said first wavelength spectrum; and
an imaging system configured to image light which has interacted with said at least one mark to provide alignment information.

16. A device manufacturing method, comprising:
providing a substrate that is at least partially covered by a layer of radiation-sensitive material;
providing a beam of radiation using a radiation system;
using a patterning device to endow said beam of radiation with a desired pattern in its cross-section;
projecting the patterned beam of radiation onto a target portion of the layer of radiation-sensitive material; and
aligning the substrate using an alignment system, said aligning comprising:
illuminating at least one mark on said substrate which is usable for alignment by producing coherent light having a high brightness and a first wavelength spectrum which is narrow and guiding said coherent light with a structure that has a second wavelength spectrum that is broader than the first wavelength spectrum, and imaging light which has interacted with said at least one mark to derive alignment information.

17. The device manufacturing method of claim 16, wherein said alignment system is configured as an off-axis alignment system.

18. The alignment system of claim 15, wherein said first mechanism comprises a laser.

19. The alignment system of claim 15, wherein said second mechanism comprises an optical fiber.

20. The alignment system of claim 19, wherein said fiber comprises a core extending in the axial direction of the fiber, the core being substantially surrounded by a medium with an index of refraction which is lower than the index of refraction of the core.

* * * * *